United States Patent [19]

Gerzberg et al.

[11] 4,285,001

[45] Aug. 18, 1981

[54] MONOLITHIC DISTRIBUTED RESISTOR-CAPACITOR DEVICE AND CIRCUIT UTILIZING POLYCRYSTALLINE SEMICONDUCTOR MATERIAL

[75] Inventors: Levy Gerzberg, Palo Alto; James D. Meindl, Los Altos, both of Calif.

[73] Assignee: Board of Trustees of Leland Stanford Jr. University, Stanford, Calif.

[21] Appl. No.: 972,738

[22] Filed: Dec. 26, 1978

[51] Int. Cl.³ .................. H01L 27/04; H01L 27/13; H01L 29/94

[52] U.S. Cl. ............................ 357/51; 357/23; 357/50; 357/59; 330/286

[58] Field of Search .................. 357/51, 59, 50, 14, 357/23, 41; 333/172; 330/286

[56] References Cited

U.S. PATENT DOCUMENTS

| | | | |
|---|---|---|---|
| 3,212,032 | 10/1965 | Kaufman | 357/14 |
| 3,576,478 | 4/1971 | Watkins | 357/59 |
| 3,621,407 | 11/1971 | Low | 333/172 |
| 3,700,976 | 10/1972 | Dill | 357/23 |
| 3,714,522 | 1/1973 | Komiya et al. | 357/23 |
| 3,792,384 | 2/1974 | Hunt | 357/59 |
| 3,829,743 | 8/1974 | Kohashi | 357/14 |
| 3,890,698 | 6/1975 | Clark | 357/59 |
| 4,001,762 | 1/1977 | Aoki et al. | 357/51 |
| 4,077,044 | 2/1978 | Hayashi | 357/59 |
| 4,092,619 | 5/1978 | Huggins | 357/51 |

OTHER PUBLICATIONS

Electronics, Sep. 4, 1959, "Network Design of Microcircuits", pp. 44-49.
Hamilton and Howard, Basic Integrated Circuit Engineering, (McGraw-Hill, N. Y. 1975) pp. 82-89.

*Primary Examiner*—William D. Larkins
*Attorney, Agent, or Firm*—Flehr, Hohbach, Test

[57] ABSTRACT

A distributed resistor-capacitor device which is highly reproducible with near ideal electrical characteristics including a substrate, an insulating layer on a major surface of the substrate, and a polycrystalline semiconductor material on the insulating layer. The polycrystalline layer is the resistor and cooperates with the substrate as the capacitor. Fabrication of the device is compatible with integrated circuit fabrication and can be used with field-effect and bipolar junction transistors.

12 Claims, 16 Drawing Figures

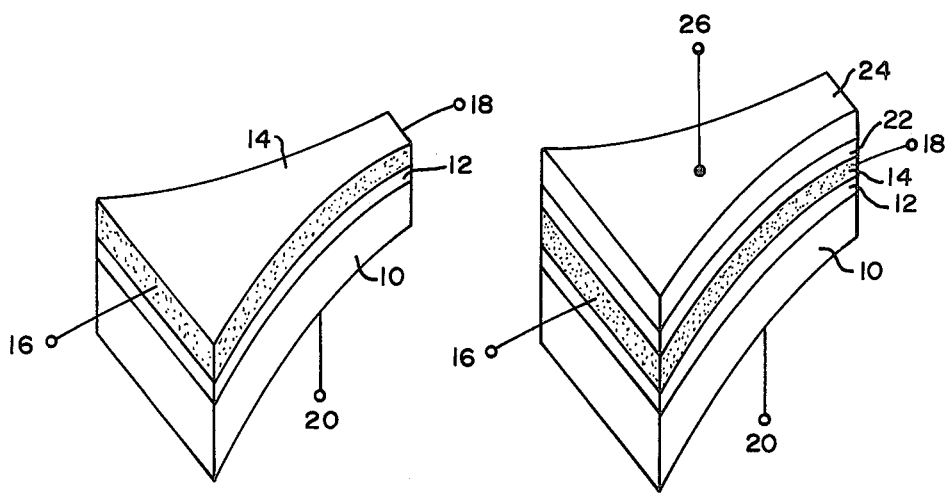
FIG.—1A
FIG.—1C
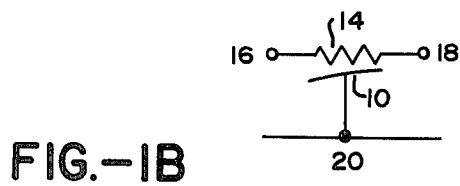
FIG.—1B
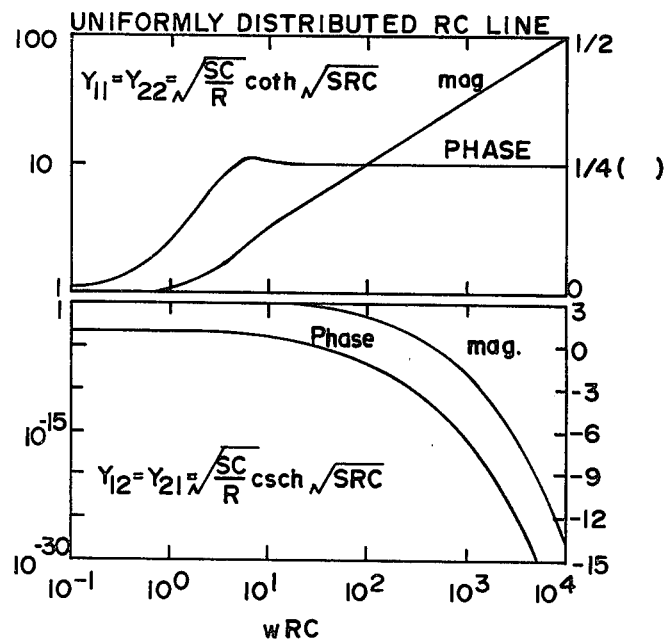
FIG.—1D

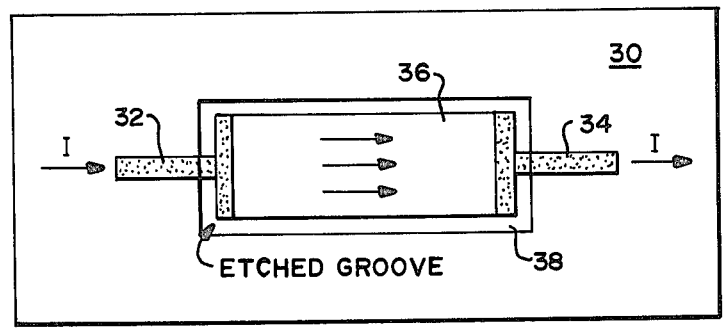
FIG.—2
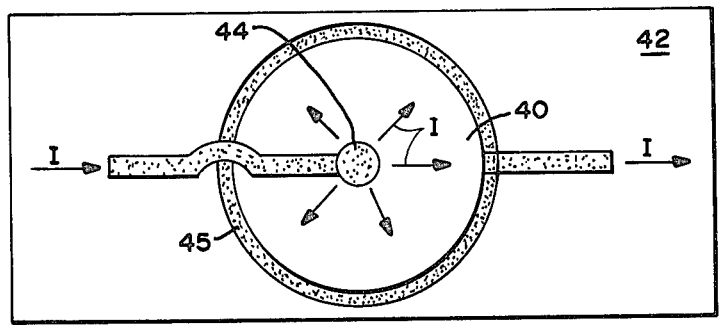
FIG.—3
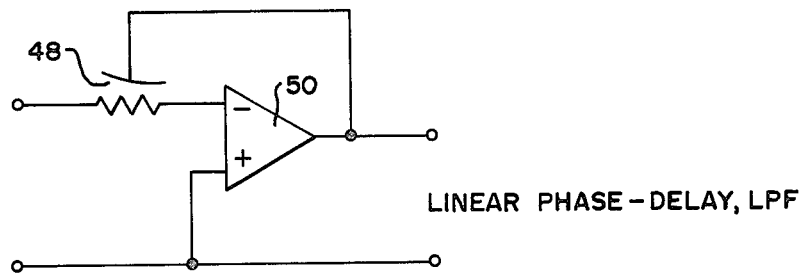
FIG.—4A

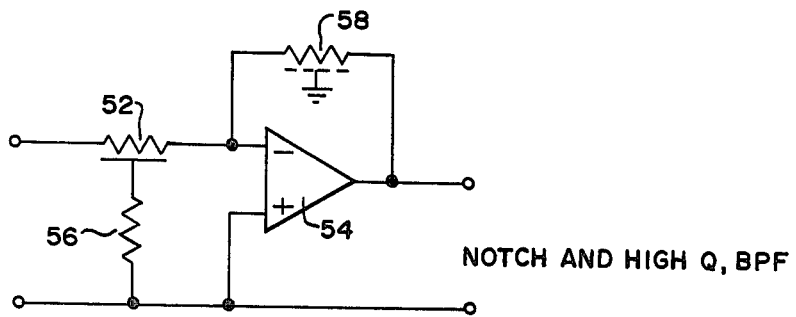
NOTCH AND HIGH Q, BPF
FIG.—4B
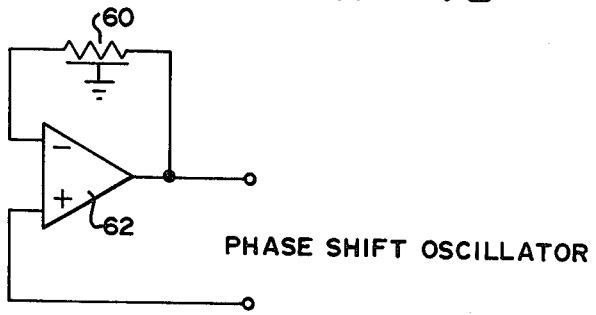
PHASE SHIFT OSCILLATOR
FIG.—4C
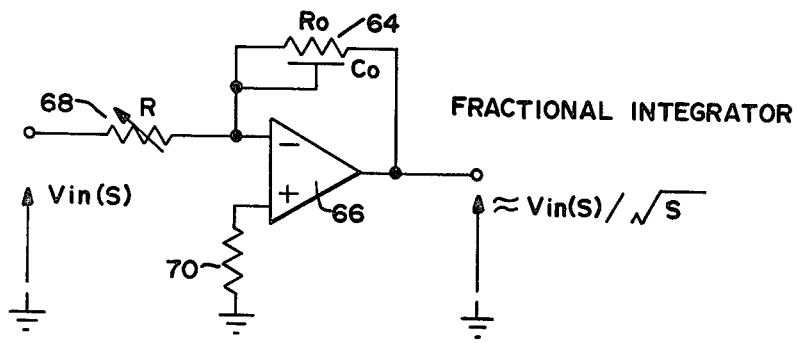
FRACTIONAL INTEGRATOR
FIG.—4D
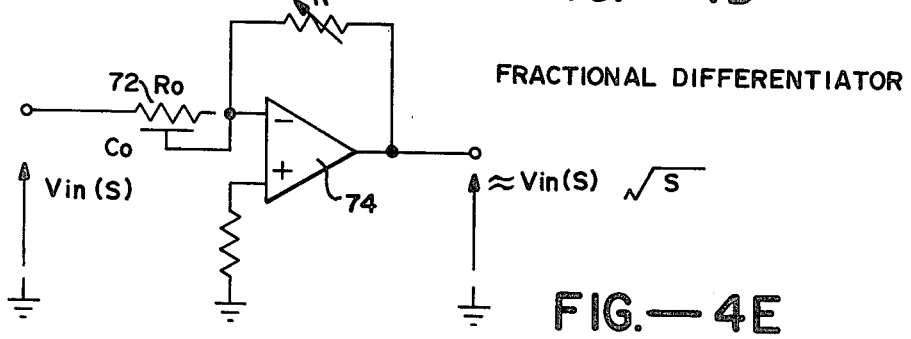
FRACTIONAL DIFFERENTIATOR
FIG.—4E

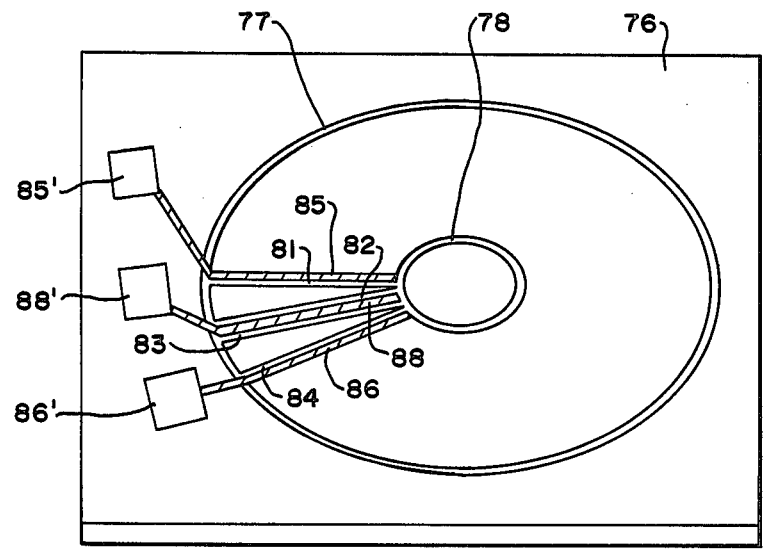
FIG.—5A
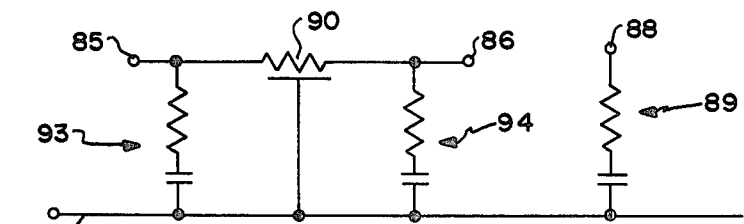
FIG.—5B
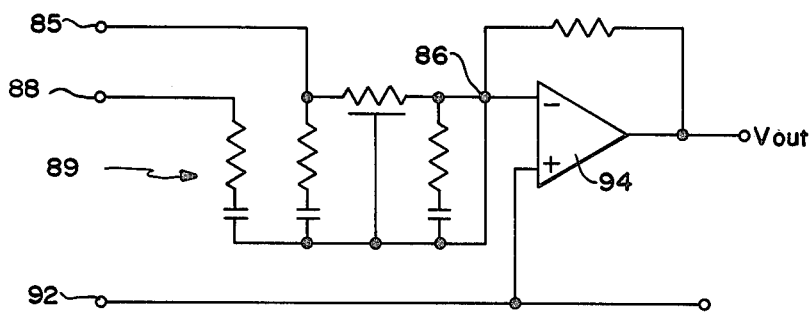
FIG.—6

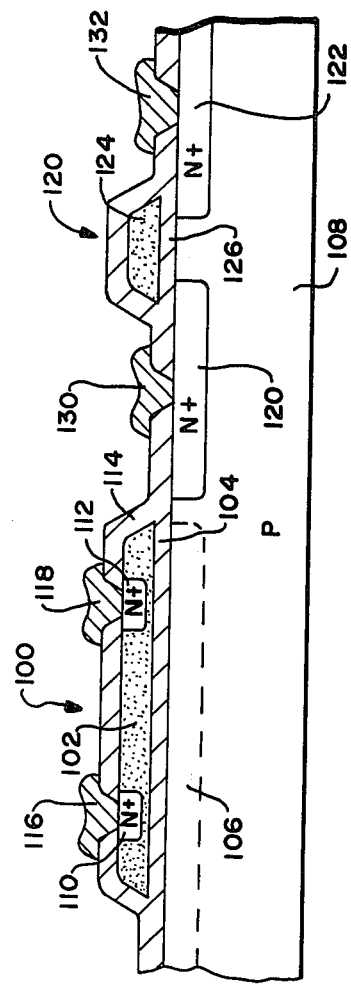
FIG.—7
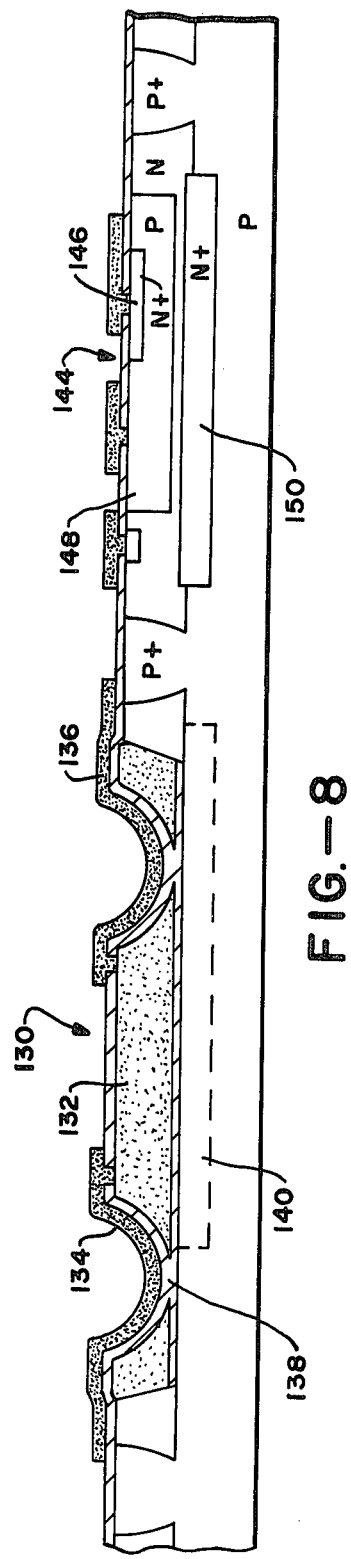
FIG.—8

MONOLITHIC DISTRIBUTED RESISTOR-CAPACITOR DEVICE AND CIRCUIT UTILIZING POLYCRYSTALLINE SEMICONDUCTOR MATERIAL

This invention relates generally to semiconductor devices, and more particularly the invention relates to a distributed resistor-capacitor device with unique electrical properties and the construction of which is compatible with integrated circuit fabrication processes.

Numerous electrical circuits have been proposed in which a distributed resistor-capacitor device is connected with an operational amplifier to provide such functions as filters, oscillators, transmission line termination simulation, and spectral moments estimation. Characteristics of the distributed resistor-capacitor device for such applications includes an input admittance which provides a constant phase shift over an operating frequency range and which has a transadmittance of a very high order low pass filter. Further, the device alone realizes the transfer function, $\sqrt{j\omega}$ where $\omega$ is the angular frequency of an applied signal.

Various devices have heretofore been proposed to achieve these functions, including a thin film resistor-capacitor RC line, as disclosed by Newcomb, *Active Integrated Circuit Synthesis,* Prentiss Hall, Inc., 1968. As described by Newcomb, such a device could consist of a resistive nickel-chromium film deposited on a titanate dielectric on top of an aluminum conductor. Such a structure is not compatible with monolithic integrated circuit techniques and requires relatively large surface areas. MOS transistor structures are suggested as an alternative, but the miniaturization and fabrication advantages thereof are offset by inherent device limitations. Applications of a thin film distributed resistor-capacitor element in lattice networks is described by Roy "On the Realization of a Constant Argument Immittance or Fractional Operator" IEEE Transactions on Circuit Theory, Volume CT-14, No. 3, September, 1967. Application of a thin film distributed RC network as a driving point impedance is disclosed by Kiski and Takashi, "Realization of a Constant Phase Driving Point Impedance with Uniformly Distributed RC Lines", Electronics and Communications in Japan, Vol. 55-A, No. 4, 1972.

While the thin film distributed resistor-capacitor structure can be used to realize a number of high performance filters, the structure is too difficult to implement for practical utilization with monolithic lumped components. Known attempts at fabricating an effective distributed RC network in monolithic form have not been useful for high performance circuit applications.

An object of the present invention is an improved distributed resistor-capacitor structure.

Another object of the invention is a distributed resistor-capacitor structure having high resistor values and large RC time constants.

Still another object of the invention is a distributed resistor-capacitor structure which is highly reproducible in miniature.

Another object of the invention is a distributed resistor-capacitor element which may be readily fabricated in monolithic form.

Yet another object of the invention is a distributed resistor-capacitor element which can be fabricated by a process which is compatible with integrated circuit fabrication techniques.

Briefly, a distributed resistor-capacitor device in accordance with the present invention comprises a semiconductor body having a doped region adjacent to a major surface of the body, an insulative material formed on the major surface and overlying the doped region, and a doped polycrystalline semiconductor material formed on the insulative material. The polycrystalline semiconductor material functions as a resistive element, and the doped region of the semiconductor body functions as a capacitive plate in association with the polycrystalline semiconductor resistor. Alternatively, an insulating layer can be formed over the resistive element with a capacitor plate formed on the insulating layer.

A monolithic semiconductor integrated circuit is readily fabricated utilizing conventional semiconductor fabrication techniques and may include at least one active electrical device and a distributed resistor-capacitor element in accordance with the invention. The distributed resistor-capacitor element is readily isolated from the active device and cooperatively functions with the active device to realize a variety of circuit functions.

In a preferred embodiment the semiconductor body is silicon, the insulative material comprises silicon oxide or silicon nitride, and the resistor is polycrystalline silicon.

The invention and objects and features thereof will be more readily apparent from the following detailed description and appended claims when taken with the drawings.

FIG. 1 (A-D) is a perspective view of two embodiments of a distributed resistor-capacitor device in accordance with the invention, the electrical symbol therefor, and a plot of electrical characteristics thereof.

FIG. 2 and FIG. 3 illustrate plan views of other embodiments of the device in accordance with the invention.

FIG. 4 (A-E) illustrates schematically several applications of a device in accordance with the invention.

FIG. 5 (A,B) is a plan view of another embodiment of the device in accordance with the invention and the electrical schematic thereof.

FIG. 6 is a schematic of circuit employing the device of FIG. 5.

FIG. 7 is a section view of a device in accordance with the present invention formed as part of the monolithic structure with a silicon gate field effect transistor.

FIG. 8 is a cross section of a monolithic integrated circuit in which a device in accordance with the present invention is formed with a bipolar junction transistor.

Referring now to the drawings, FIG. 1 (A) illustrates in perspective view one embodiment of a distributed resistor-capacitor device in accordance with the present invention. The device includes a substrate 10 which may comprise a doped semiconductor substrate that functions as a support for the resistor element and as one plate of a distributed capacitor. On one surface of substrate 10 is formed a dielectric material 12 such as silicon oxide which may be formed by conventional vapor deposition or by thermal oxidation of the silicon substrate 10. Formed on the dielectric layer 12 is a resistor element 14 comprising doped polycrystalline semiconductor material.

In a preferred embodiment using a silicon substrate and silicon oxide or silicon nitride dielectric layer, the resistive layer is polycrystalline silicon.

Typically, the substrate is several mils in thickness, the dielectric layer is on the order of 1,000 angstroms, and the polycrystalline material is on the order of five microns. Surface area, configuration, and resistivity are selected for the desired electrical characteristics and circuit application of the device. Importantly, the doped polycrystalline material is subjected to high temperature annealing (at least 1,100° C. for at least thirty minutes). The annealing and further high temperature steps uniformly distribute the dopants within the polycrystalline material. Alternatively, radiation annealing can be employed as disclosed in co-pending application Ser. No. 950,828, filed Oct. 12, 1978 now U.S. Pat. No. 4,214,918. A device as described can realize long time constant (e.g. 0.2 second on less than a 1×1 mm area) due to the high resistance realized with polycrystalline material such as silicon.

The resistive element 14 also functions as one plate of the distributed capacitor in conjunction with substrate 10 and a dielectric layer 12. A highly doped buried layer, as utilized in bipolar processing, can be formed in the substrate as the capacitor plate. Advantageously, the device can then be isolated by PN junction isolation. Contacts 16 and 18 are made to either end of resistive element 14 and a contact 20 is made to the substrate 10 which forms the other capacitor plate. FIG. 1 (B) is the electric symbol for the device of FIG. 1 (A) with like components having the same reference numerals.

Alternatively, as shown in FIG. 1 (C) the device of FIG. 1 (A) is modified by adding a second dielectric layer 22 on top of the resistive element 14 and a metal layer 24 on top of layer 22. A second capacitor contact 26 is made to metal layer 24 and when connected with contact 20 the capacitive element is effectively doubled in size. Alternatively contact 20 may be eliminated, and the resistor-capacitor is electrically isolated from the substrate.

FIG. 1 (D) is a plot of frequency response on a logrithmic scale of a uniformly distributed resistor-capacitor line. Frequency as a function of $\omega$ RC is plotted logrithmically on the abscissa, shorted output input admittance frequency response in magnitude and phase are plotted logrithmically along the ordinate axis in the upper half of the curve, and transadmittance frequency response in phase and magnitude are plotted logrithmically in the lower half of the curve. The input admittance plotted in the top half of the curve has a constant phase shift and a linear magnitude response which is proportional to log $\sqrt{\omega RC}$. The transadmittance behaves as a very high order low pass filter.

A single distributed RC device in accordance with this invention has realized the illustrated frequency characteristics, whereas a realization of such filters with conventional monolithic lumped components would require a prohibitively large number of accurate and well matched elements. A single distributed resistor-capacitor device in accordance with the invention produced the transfer function $\sqrt{j\omega}$ over the audio range 20 Hz to 20 Khz with an absolute accuracy in magnitude and phase of ±0.5 percent.

While the device illustrated in FIG. 1 (A) is in the form of a tapered line, other constructions may be utilized as illustrated by way of example in FIGS. 2 and 3. In FIG. 2 a plan view of a device is illustrated which is formed in a semiconductor substrate 30. Contacts 32 and 34 are made at either end of a uniform polycrystalline resistive element 36 with current flow as illustrated. When the device forms part of an integrated circuit, isolation of the device from other circuit components may be provided by a diffused PN junction (for low resistivity polycrystalline silicon) or by dielectric isolation as illustrated at 38. As will be described further hereinbelow with reference to FIG. 8, suitable isolation must be provided for the device when incorporated in a bipolar junction transistor integrated circuit, and such isolation can be provided by junction isolation or by dielectric isolation.

FIG. 3 is a plan view of another embodiment illustrating the layout of a device in accordance with the invention. In this embodiment the resistive element 40 is circular in configuration and is formed in a semiconductor substrate 42. An ohmic contact 44 is made to the central portion of resistor 40 and a second ohmic contact 45 is made to the periphery of the circular resistive element. Thus, the physical configuration of the device, along with fabrication techniques, can determine the resistive and capacitive values for the device. Importantly, electrical isolation is not required with this structure. Further, by making the interior contact a ring, electrical elements comprising an integrated circuit can be fabricated within the ring and electrically connected to the distributed resistor-capacitor element.

FIG. 4 (A-E) illustrates schematically several known applications of a distributed resistor-capacitor structure in accordance with the invention. In FIG. 4 (A) a device 48 is connected to one input of an operational amplifier 50 with the capacitive element providing feedback. Such a configuration provides a linear phase delay low pass filter.

In FIG. 4 (B) a first device 52 is connected in one input to operational amplifier 54 with the capacitive element thereof serially connected with a resistor 56 across the input terminals and forms a notch filter. Alternatively, the device 58 can be provided in the feedback loop of operational amplifier 54, and the circuit provides a high Q bandpass filter.

In FIG. 4 (C) a single device 60 is connected in the feedback loop of operational amplifier 62 to provide a phase shift oscillator.

FIG. 4 (D) illustrates a fractional integrator with the distributed RC device 64 connected in the feedback loop of operational amplifier 66. A variable resistor 68 is provided in one input and a fixed resistor 70 is provided in the other input line to operational amplifier 66. As noted, this configuration gives a frequency response approximated by $$v_{out}(S) = V_{in}(S) / \sqrt{S}$$

FIG. 4 (E) illustrates a fractional differentiator wherein the distributed RC device 72 is connected to the input to operational amplifier 74 with a variable resistor provided in the feedback loop. This device gives a frequency response approximated by $$V_{out}(S) = V_{in}(S) \times \sqrt{S}$$

FIG. 5 is a plan view of another embodiment of a device in accordance with the invention in which a compensating contact comprising a resistor and capacitor are built into the device to compensate for contact resistance and capacitance. In this embodiment a layer of polycrystalline semiconductor material is deposited on a thin film of silicon oxide overlying a silicon substrate, and two concentric circular grooves 77 and 78 are etched through the polycrystalline layer 76. In addition, four radial grooves 81-84 are etched through the polysilicon layer 76 extending from the outer circle 77 to the inner circle 78. The resistive element in this device is defined by the polysilicon material lying between the concentric circles 77 and 78 with ohmic contacts thereto formed at 85 and 86. The substrate underlying this portion of the polysilicon layer forms the other plate of the distributed capacitor.

To compensate for parasitic contact capacitance or resistance or any impedance to substrate, grooves 82, 83 are etched in the polysilicon to form an isolated section 87 which has the same dimensions as the contacts 85 and 86 and therefore the same impedance to substrate. The contact 88 on section 87 is identical to contacts 85 and 86. To facilitate electrical connections to the devices by wire bonding or by metal lines, for example, the contacts 85, 86 and 88 are interconnected to corresponding metal pads 85', 86' and 88'.

In a device of the type illustrated in FIG. 5 and fabricated in an integrated circuit for use with low power bipolar transistors, polycrystalline silicon was deposited at 1,050° C. along with a 5 ohm-cm, 5 micron thick single crystal silicon epitaxial layer. The original resistivity of the polycrystalline silicon was $5 \times 10^5$ ohm-cm and was reduced to $5 \times 10^3$ ohm-cm by ion implantation of boron. In forming the grooves, an oxide mask was employed, and after groove formation the mask was removed and a new oxide grown to provide a smooth step suitable for subsequent metallization.

FIG. 5 (B) is an electrical schematic of the structure of FIG. 5 (A) with the distributed resistor-capacitor device 90 connected between input terminal 85, output terminal 86 and common terminal 92. The input and output contact parasitic current path is illustrated by serially connected resistors and capacitors shown generally at 93 and 94, and the compensating resistor-capacitor structure 89 is connected between terminal 88 and the common terminal 92.

FIG. 6 illustrates schematically the structure of FIG. 5 electrically connected with differential amplifier 94 to perform a fractional differentiator function such as previously illustrated in FIG. 4 (D). By applying a negative input signal to the compensating network as shown by $-v_{in}$, improved accuracy is realized by injecting a compensating current for the parasitic current of the contacts. It will be appreciated that the parasitic current can be reduced by other techniques, such as by way of example, increasing the oxide thickness between the contact and the underlying substrate.

In addition to the unique characteristics provided by a single distributed resistor-capacitor device as described, fabrication of the structure is compatible with integrated circuit fabrication techniques.

FIG. 7 is a section view of a device in accordance with the invention fabricated with a silicon gate field effect transistor in an integrated monolithic structure. The distributed resistor-capacitor is shown generally at 100 and includes a high resistance polycrystalline silicon layer 102 overlying a silicon oxide layer 104 and a N+ diffused region 106 in the P substrate 108. N+ contacts 110 and 112 are diffused using an overlying silicon oxide layer 114 as a mask. This diffusion is made simultaneously with the diffusion of the source 120 and drain 122 of the MOS transistor. Aluminum contacts 116 and 118 are made to the diffused regions, respectively, for ohmic contact to the resistor 102.

The field effect transistor 120 includes N+ source and drain regions 120 and 122 formed in the P substrate 108. The doped polysilicon gate 124 is formed over gate oxide 126, and metallic source and drain contacts 130 and 132 are provided through holes in silicon oxide 114 to the source and gate regions 120, 122, respectively.

An example illustrating the major fabrication steps for this device utilizing conventional MOS processing techniques is as follows:

1. Start with a P substrate
2. Grow field oxide
3. Define and dope conductive layer 106 if isolated plate is desired
4. Grow gate oxide
5. Deposit polycrystalline silicon
6. Implant polysilicon with low dose N type dopant suitable for desired high resistivity
7. Oxidize, define resistor, gate and interconnect poly lines
8. Etch poly-resistor and gate definition
9. Oxidize, remove oxide except from resistor area
10. High dose implant or diffusion of gate drain and source and contacts to distributed resistor
11. Regrow oxide
12. Etch oxide, deposit metal contacts It is noted that in the structure of FIG. 7 distributed resistor-capacitor device is self-isolated from the field-effect transistor. However, in the formation of the distributed resistor-capacitor device with bipolar junction transistor structures in an integrated circuit, electrical isolation of the distributed RC device from the transistor is necessary.

Referring now to FIG. 8 a cross section view of an integrated circuit including the distributed RC device and a bipolar junction transistor is illustrated. The distributed RC device 130 includes a polycrystalline silicon resistor 132 with ohmic contacts 134 and 136 provided thereto. The polycrystalline resistor 132 is insulated from the diffused region 140 in the silicon substrate by a silicon oxide layer 138.

A bipolar transistor 144 comprises a N+ emitter 146, a P-type base 148 formed in an N-type epitaxial layer, and a collector including the epitaxial layer and buried N+ layer 150.

Fabrication of the distributed RC device with the bipolar junction transistor utilizing conventional techniques is briefly outlined as follows:

1. Start with a P substrate
2. Oxidize, etch and diffuse N+ buried layer for bipolar junction transistor
3. Define silicon oxide on the surface area for the polycrystalline silicon definition
4. Epitaxial growth on the substrate for the bipolar junction transistor, polysilicon deposition on the silicon oxide for the resistor
5. Form oxide coating, diffuse P+ isolation region through epitaxial layer to the P substrate
6. Etch polycrystalline silicon to silicon oxide layer to define resistor
7. Deposit oxide, base and polycrystalline resistor ion implantations
8. Oxidize and drive-in base and resistor regions
9. Etch oxide, diffuse emitter and collector contact
10. Etch oxide, contact metallization deposited As described above, the distributed resistor-capacitor device in accordance with the present invention achieves near ideal electrical characteristics in a single structure. Further, the device is readily fabricated in an integrated circuit using either field effects transistors or bipolar junction transistors. A number of circuit applications for the device have been described for illustration purposes.

Thus, while the invention has been described with reference to specific embodiments and applications, the description is for illustration purposes only and is not to be construed as limiting the scope of the invention. Various modifications and applications may occur to those skilled in the art without departing from the true spirit and scope of the invention as defined by the appended claims.

What is claimed is:

1. A distributed resistor-capacitor device comprising a semiconductor body, said semiconductor body including a doped region adjacent to a major surface of said body, an insulative material on said major surface, a doped polycrystalline semiconductor resistive material formed on said insulative material, and current compensating means for compensating for contact parasitic current, said resistive material formed in a generally circular pattern with at least one radial portion of said resistive material removed, and a concentric circular portion of said resistive material removed, said radial portion extending to and electrically contacting said concentric circular portion, first and second electrical contacts to said resistive material on opposing sides of said radial portion, a third contact to said resistive material within said radial portion, and a capacitor electrical contact to said doped region, whereby said first, second, and capacitor contacts are to said distributed resistor-capacitor element, and said third and capacitor electrical contacts are to a current compensating impedance to said substrate.

2. A semiconductor integrated circuit comprising a semiconductor body, a bipolar junction transistor formed in said semiconductor body adjacent to one major surface of said body, and a distributed resistor-capacitor device formed adjacent to said one major surface and adjacent to said bipolar junction transistor, said distributed resistor-capacitor device including a doped region of said semiconductor body, an insulative material on said major surface overlying said doped region, a resistive material formed on said insulative material, said resistive material comprising doped polycrystalline semiconductor material, first and second contacts to said resistive material, a capacitor contact to said doped region, said semiconductor body including an epitaxial layer with said bipolar junction transistor formed in a portion of said epitaxial layer, said distributed resistor-capacitor device being electrically isolated from said bipolar junction transistor by a groove etched through said polysilicon layer.

3. A semiconductor integrated circuit comprising a semiconductor body, a bipolar junction transistor formed in said semiconductor body adjacent to one major surface of said body, and a distributed resistor-capacitor device formed adjacent to said one major surface and adjacent to said bipolar junction transistor, said distributed resistor-capacitor device including a doped region of said semiconductor body, an insulative material on said major surface overlying said doped region, a resistive material formed on said insulative material, said resistive material comprising doped polycrystalline semiconductor material, first and second contacts to said resistive material, and a capacitor contact to said doped region, said semiconductor body including an epitaxial layer with said bipolar junction transistor formed in a portion of said epitaxial layer, said distributed resistor-capacitor device being electrically isolated from said bipolar junction transistor by dielectric isolation material formed in said polysilicon layer and surrounding said element.

4. A semiconductor integrated circuit comprising a semiconductor body, a silicon gate field effect transistor formed in said semiconductor body adjacent to one major surface of said body, and a distributed resistor-capacitor device formed adjacent to said one major surface and adjacent to said transistor, said distributed resistor-capacitor device including a doped region of said semiconductor body, an insulative material on said major surface overlying said doped region, a resistive material formed on said insulative material, said resistive material comprising doped polycrystalline semiconductor material, first and second contacts to said resistive material, and a capacitor contact to said doped region.

5. A semiconductor integrated circuit as defined by claim 4 wherein said distributed resistor-capacitor element is electrically isolated from said silicon gate field effect transistor.

6. A distributed resistor-capacitor device comprising a semiconductor body, said semiconductor body including a doped region adjacent to a major surface of said body, an insulative material on said major surface, a doped polycrystalline semiconductor resistive material formed on said insulative material, additional insulative material over said resistive material, a conductive layer over said additional insulative material, said conductive layer and said doped region comprising capacitor plates, first and second contacts to said resistive material and a capacitor contact to at least one of said capacitor plates.

7. A distributed resistor-capacitor device as defined by claim 6 wherein said conductive material comprises a metal.

8. A semiconductor integrated circuit comprising a semiconductor body, an active electrical device formed in said semiconductor body adjacent to one major surface of said body, and a distributed resistor-capacitor device formed adjacent to said one major surface and adjacent to said active device, said distributed resistor-capacitor device including a doped region of said semiconductor body, an insulative material on said major surface overlying said doped region, a resistive material formed on said insulative material, said resistive material comprising doped polycrystalline semiconductor material, additional insulative material over said resistive material, a conductive layer over said additional insulative material, said conductive layer and said doped region comprising capacitor plates, first and second contacts to said resistive material and a capacitor contact to at least one of said capacitor plates.

9. A distributed resistor-capacitor device comprising a substrate, a doped polycrystalline semiconductor resistive material on said substrate, a dielectric layer over said resistive material, a conductive layer over said dielectric layer, first and second contacts to said resistive material, and a capacitor contact to said conductive layer.

10. A distributed resistor-capacitor device as defined by claim 9 wherein said conductive layer is a metal.

11. A distributed resistor-capacitor device as defined by claims 9 or 10 wherein said substrate comprises a semiconductor body and a dielectric layer on a major surface of said semiconductor body.

12. A distributed resistor-capacitor device as defined by claim 11 wherein said semiconductor body includes a doped region adjacent to said major surface, and further including a second capacitor contact to said doped region.

* * * * *